United States Patent
Zhou et al.

(10) Patent No.: US 7,311,856 B2
(45) Date of Patent: Dec. 25, 2007

(54) POLYMERIC INHIBITORS FOR ENHANCED PLANARIZATION

(75) Inventors: Renjie Zhou, Aurora, IL (US); Steven K. Grumbine, Aurora, IL (US); Jian Zhang, Aurora, IL (US); Isaac K. Cherian, Aurora, IL (US)

(73) Assignee: Cabot Microelectronics Corporation, Aurora, IL (US)

( * ) Notice: Subject to any disclaimer, the term of this patent is extended or adjusted under 35 U.S.C. 154(b) by 309 days.

(21) Appl. No.: 11/093,806

(22) Filed: Mar. 30, 2005

(65) Prior Publication Data

US 2006/0226126 A1 Oct. 12, 2006

(51) Int. Cl.
- C09K 13/00 (2006.01)
- C09K 13/06 (2006.01)
- H01L 21/302 (2006.01)

(52) U.S. Cl. .................. 252/79.1; 252/79.4; 438/692
(58) Field of Classification Search ............... 252/79.1, 252/79.4; 438/692
See application file for complete search history.

(56) References Cited

U.S. PATENT DOCUMENTS

| | | | |
|---|---|---|---|
| 5,196,353 A | 3/1993 | Sandhu et al. | |
| 5,229,393 A | 7/1993 | Clough et al. | |
| 5,308,641 A | 5/1994 | Cahalan et al. | |
| 5,391,636 A | 2/1995 | Schilling | |
| 5,433,651 A | 7/1995 | Lustig et al. | |
| 5,523,379 A | 6/1996 | Rosenquist | |
| 5,609,511 A | 3/1997 | Moriyama et al. | |
| 5,643,046 A | 7/1997 | Katakabe et al. | |
| 5,650,234 A | 7/1997 | Dolence et al. | |
| 5,658,183 A | 8/1997 | Sandhu et al. | |
| 5,730,642 A | 3/1998 | Sandhu et al. | |
| 5,807,963 A | 9/1998 | Rosenquist | |
| 5,838,447 A | 11/1998 | Hiyama et al. | |
| 5,872,165 A | 2/1999 | Oberg et al. | |
| 5,872,633 A | 2/1999 | Holzapfel et al. | |
| 5,893,796 A | 4/1999 | Birang et al. | |
| 5,900,487 A | 5/1999 | Rosenquist | |
| 5,919,891 A | 7/1999 | Rosenquist | |
| 5,949,927 A | 9/1999 | Tang | |
| 5,962,558 A | 10/1999 | Rosenquist | |
| 5,964,643 A | 10/1999 | Birang et al. | |
| 6,147,163 A | 11/2000 | Boisseau et al. | |
| 6,166,148 A | 12/2000 | Ohrbom et al. | |
| 6,180,240 B1 | 1/2001 | St. Aubin et al. | |
| 6,375,693 B1 | 4/2002 | Cote et al. | |
| 6,379,223 B1 | 4/2002 | Sun et al. | |
| 6,447,563 B1 | 9/2002 | Mahulikar | |
| 6,561,883 B1 | 5/2003 | Kondo et al. | |
| 6,562,719 B2 | 5/2003 | Kondo et al. | |
| 6,585,568 B2 | 7/2003 | Tsuchiya et al. | |
| 6,632,259 B2 | 10/2003 | Weinstein et al. | |
| 6,646,082 B2 | 11/2003 | Ghosh et al. | |
| 6,774,238 B2 | 8/2004 | Pastor et al. | |
| 6,821,897 B2 | 11/2004 | Schroeder et al. | |
| 2003/0168343 A1 | 9/2003 | Commander et al. | |
| 2004/0162011 A1 | 8/2004 | Konno et al. | |
| 2005/0005525 A1 | 1/2005 | Yuzhuo et al. | |
| 2005/0031789 A1* | 2/2005 | Liu et al. | 427/340 |
| 2005/0227451 A1 | 10/2005 | Konno et al. | |
| 2005/0282391 A1 | 12/2005 | Vacassy | |

FOREIGN PATENT DOCUMENTS

| | | |
|---|---|---|
| JP | 03-322771 | 9/2002 |
| WO | WO 98/27146 A1 | 6/1998 |
| WO | WO 98/27168 A1 | 6/1998 |
| WO | WO 2005/047410 A1 | 5/2005 |

OTHER PUBLICATIONS

Carpio et al., *Thin Solid Films*, 266(2), 238-244 (1995).
Dabak et al., *Heterocyclic Communications*, 8(1), 61-64 (2002).
Gutmann et al., *Thin Solid Films*, 270(1-2), 596-600 (1995).
Kumar et al., *Advanced Metallization For Future ULSI*, 427, 237-242 (1996).
Luo et al., *Langmuir, The ACS Journal of Surfaces and Colloids*, 12(15), 3563-3566 (1996).

* cited by examiner

*Primary Examiner*—Nadine G. Norton
*Assistant Examiner*—Lynette T. Umez-Eronini
(74) *Attorney, Agent, or Firm*—Thomas Omholt; Francis J. Koszyk

(57) ABSTRACT

The invention provides a chemical-mechanical polishing system comprising a polishing component, a surfactant, and a liquid carrier. The invention further provides a method of chemically-mechanically polishing a substrate with the polishing system.

50 Claims, No Drawings

POLYMERIC INHIBITORS FOR ENHANCED PLANARIZATION

FIELD OF THE INVENTION

This invention pertains to a chemical-mechanical polishing system and a method for polishing a substrate using the same.

BACKGROUND OF THE INVENTION

Compositions and methods for planarizing or polishing the surface of a substrate, especially for chemical-mechanical polishing (CMP), are well known in the art. Polishing compositions (also known as polishing slurries) typically contain an abrasive material in an aqueous solution and are applied to a surface by contacting the surface with a polishing pad saturated with the polishing composition. Typical abrasive materials include silicon dioxide, cerium oxide, aluminum oxide, zirconium oxide, and tin oxide. The polishing composition is typically used in conjunction with a polishing pad (e.g., polishing cloth or disk). Alternatively, the abrasive material may be incorporated into the polishing pad.

Polishing compositions for silicon-based inter-metal dielectric layers have been particularly well developed in the semiconductor industry, and the chemical and mechanical nature of polishing and wear of the silicon-based dielectrics is reasonably well understood. One problem with the silicon-based dielectric materials, however, is that their dielectric constant is relatively high, being approximately 3.9 or higher, depending on factors such as residual moisture content. As a result, the capacitance between the conductive layers is also relatively high, which in turn limits the speed (frequency) at which a circuit can operate. Strategies being developed to reduce the capacitance include (1) incorporating metals with lower resistivity values (e.g., copper), and (2) providing electrical isolation with insulating materials having lower dielectric constants relative to silicon dioxide.

One way to fabricate planar copper circuit traces on a silicon dioxide substrate is referred to as the damascene process. In accordance with this process, the silicon dioxide dielectric surface is patterned by a conventional dry etch process to form holes and trenches for vertical and horizontal interconnects. The patterned surface is coated with an adhesion-promoting layer such as titanium or tantalum and/or a diffusion barrier layer such as titanium nitride or tantalum nitride. The adhesion-promoting layer and/or the diffusion barrier layer are then over-coated with a copper layer. Chemical-mechanical polishing is employed to reduce the thickness of the copper over-layer, as well as the thickness of any adhesion-promoting layer and/or diffusion barrier layer, until a planar surface that exposes elevated portions of the silicon dioxide surface is obtained. The vias and trenches remain filled with electrically conductive copper forming the circuit interconnects.

Previously, it was believed that the removal rate of the copper and the adhesion-promoting layer and/or the diffusion barrier layer must both greatly exceed the removal rate of silicon dioxide so that polishing effectively stops when elevated portions of the silicon dioxide are exposed. The ratio of the removal rate of copper to the removal rate of silicon dioxide base is called "selectivity." A minimum selectivity of about 50 was desired for such chemical-mechanical polishing. However, when high selectivity copper slurries are used, the copper layers are easily over-polished creating a depression or "dishing" effect in the copper vias and trenches. Furthermore, a certain amount of overpolish during copper CMP is required to clear off all surface metal residue between metal patterns and to ensure electrical isolation between neighboring circuits. During overpolish, multiple materials are polished simultaneously at different polishing rates. Overpolishing, therefore, can result in copper dishing and silicon dioxide erosion, which are highly pattern dependent. Copper dishing results from the selectivity of copper polishing systems for copper, whereas erosion refers to a topography difference between regions with no metal pattern or very low metal pattern and dense arrays of copper trenches or vias. The industry standard for erosion is typically less than 500 Angstroms (Å).

A number of systems for chemical-mechanical polishing of copper have been disclosed. Kumar et al., "Chemical-Mechanical Polishing of Copper in Glycerol Based Slurries" (Materials Research Society Symposium Proceedings, 1996) discloses a slurry that contains glycerol and abrasive alumina particles. Gutmann et al., "Chemical-Mechanical Polishing of Copper with Oxide and Polymer Interlevel Dielectrics" (Thin Solid Films, 1995), discloses slurries based on either ammonium hydroxide or nitric acid that may contain benzotriazole (BTA) as an inhibitor of copper dissolution. Luo et al., "Stabilization of Alumina Slurry for Chemical-Mechanical Polishing of Copper" (Langmuir, 1996), discloses alumina-ferric nitrate slurries that contain polymeric surfactants and BTA. Carpio et al., "Initial Study on Copper CMP Slurry Chemistries" (Thin Solid Films, 1995), discloses slurries that contain either alumina or silica particles, nitric acid or ammonium hydroxide, with hydrogen peroxide or potassium permanganate as an oxidizer. While present day chemical-mechanical polishing systems are capable of removing a copper over-layer from a silicon dioxide substrate, the systems do not entirely satisfy the rigorous demands of the semiconductor industry. These requirements can be summarized as follows. First, there is a need for high removal rates of copper to satisfy throughput demands. Secondly, there must be excellent topography uniformity across the substrate. Finally, the CMP method must minimize local dishing and erosion effects to satisfy ever increasing lithographic demands.

To this end, copper CMP compositions have been devised which include inhibitors of copper overpolishing. Typically, such inhibitors comprise nitrogen-containing compounds, for example, amines and small molecular weight nitrogen-containing heterocyclic compounds such as benzotriazole, 1,2,3-triazole, and 1,2,4-triazole. For example, U.S. Pat. No. 6,585,568 describes a CMP polishing slurry for polishing a copper-based metal film formed on an insulating film, comprising a polishing material, an oxidizing agent, and water as well as a benzotriazole compound and a triazole compound, wherein the mixing ratio of the triazole compound to the benzotriazole compound is 5 to 70. U.S. Pat. No. 6,375,693 discloses a slurry for polishing a tantalum-based barrier layer for copper-based metallurgy, consisting of hydrogen peroxide for oxidizing copper, a copper oxidation inhibitor, an additive that regulates complexing between copper and the oxidation inhibitor, and colloidal silica, wherein the oxidation inhibitor is selected from the group consisting of 1-H benzotriazole, 1-hydroxybenzotriazole, 1-methylbenzotriazole, 5-methylbenzotriazole, benzimidazole, 2-methylbenzimidazole, and 5-chlorobenzotriazole. The purpose of the copper oxidation inhibitor is to reduce etching of copper within trenches by hydrogen peroxide after the copper layers have been planarized.

However, despite the improvements achieved in the reduction of dishing and erosion in the CMP of copper-containing substrates with the use of small molecular weight heterocyclic copper inhibitors, it is well known that excessive amounts of inhibitors, such as benzotriazole, result in a reduction of the polishing rate for copper, forcing a tradeoff between erosion inhibition and attainment of practical polishing rates. Furthermore, the use of copper corrosion inhibiting compounds, such as triazole compounds, in CMP compositions has been found to increase the incidence of defects, such as precipitates and copper stains. Thus, there remains a need in the art for improved polishing systems and methods for the chemical-mechanical planarization of substrates comprising copper layers.

The invention provides such a system and method. These and other advantages of the invention, as well as additional inventive features, will be apparent from the description of the invention provided herein.

BRIEF SUMMARY OF THE INVENTION

The invention provides a chemical-mechanical polishing system comprising (a) a polishing component selected from the group consisting of a polishing pad, an abrasive, and a combination thereof, (b) a surfactant comprising at least one azole group, wherein the surfactant is not polyvinylimidazole and wherein the surfactant does not comprise cyclic imide groups or both pendant amide and ester groups, and (c) a liquid carrier. The invention further provides a method of chemically-mechanically polishing a substrate, comprising (i) contacting a substrate with a polishing system comprising (a) a polishing component selected from the group consisting of a polishing pad, an abrasive, and a combination thereof, (b) a surfactant comprising at least one azole group, wherein the surfactant is not polyvinylimidazole and wherein the surfactant does not comprise cyclic imide groups or both pendant amide and ester groups, and (c) a liquid carrier, (ii) moving the polishing pad relative to the substrate, and (iii) abrading at least a portion of the substrate to polish the substrate.

DETAILED DESCRIPTION OF THE INVENTION

The invention provides a chemical-mechanical polishing (CMP) system comprising a polishing component, a surfactant, and a liquid carrier. The liquid carrier and any components dissolved or suspended therein form the polishing composition of the chemical-mechanical polishing system. The invention desirably allows for polishing of a substrate containing at least one copper layer.

The polishing component is selected from the group consisting of a polishing pad, an abrasive and the combination of a polishing pad and an abrasive. If an abrasive is present, the abrasive can be in any suitable form (e.g., abrasive particles). The abrasive can be fixed on the polishing pad and/or can be in particulate form and suspended in the liquid carrier. The polishing pad can be any suitable polishing pad, many of which are known in the art.

The abrasive can be any suitable abrasive, for example the abrasive can be natural or synthetic, and can comprise diamond (e.g., polycrystalline diamond), garnet, glass, carborundum, metal oxide, carbide, nitride, and the like. The abrasive desirably comprises a metal oxide. Suitable metal oxides include metal oxides selected from the group consisting of alumina, silica, titania, ceria, zirconia, germania, magnesia, co-formed products thereof, and combinations thereof. Preferably, the metal oxide is alumina or silica. The abrasive particles typically have an average particle size (e.g., average particle diameter) of about 20 nm to about 500 nm. Preferably, the abrasive particles have an average particle size of about 70 nm to about 300 nm (e.g., about 100 nm to about 200 nm).

When the abrasive is suspended in the liquid carrier (i.e., when the abrasive is a component of the polishing composition), any suitable amount of abrasive can be present in the polishing composition. Typically, about 0.01 wt. % or more (e.g., about 0.05 wt. % or more) abrasive will be present in the polishing composition. More typically, about 0.1 wt. % or more abrasive will be present in the polishing composition. The amount of abrasive in the polishing composition typically will not exceed about 20 wt. %, more typically will not exceed about 10 wt. % (e.g., will not exceed about 5 wt. %). Preferably, the amount of abrasive in the polishing composition is about 0.05 wt. % to about 2 wt. %, and more preferably about 0.1 wt. % to about 1 wt. %.

The abrasive desirably is suspended in the polishing composition, more specifically in the liquid carrier of the polishing composition. When the abrasive is suspended in the polishing composition, the abrasive preferably is colloidally stable. The term colloid refers to the suspension of abrasive particles in the liquid carrier. Colloidal stability refers to the maintenance of that suspension over time. In the context of this invention, an abrasive is considered colloidally stable if, when the abrasive is placed into a 100 ml graduated cylinder and allowed to stand unagitated for a time of 2 hours, the difference between the concentration of particles in the bottom 50 ml of the graduated cylinder ([B] in terms of g/ml) and the concentration of particles in the top 50 ml of the graduated cylinder ([T] in terms of g/ml) divided by the initial concentration of particles in the abrasive composition ([C] in terms of g/ml) is less than or equal to 0.5 (i.e., $\{[B]-[T]\}/[C] \leq 0.5$). The value of $[B]-[T]/[C]$ desirably is less than or equal to 0.3, and preferably is less than or equal to 0.1.

The surfactant comprises at least one azole group, wherein the surfactant is not polyvinylimidazole and wherein the surfactant does not comprise cyclic imide groups or both pendant amide and ester groups. Polyvinylimidazole includes homopolymers derived from the polymerization of vinyl-substituted imidazoles wherein the vinyl group is bonded directly to the imidazole ring, although the surfactant can comprise copolymers of vinylimidazoles with other monomers. The surfactant does not comprise cyclic imide groups. Further, the surfactant does not comprise both pendant amide and ester groups, wherein pendant refers to the attachment of the amide and ester groups to a polymeric backbone but wherein the amide and ester groups are not directly a part of the polymeric backbone. The surfactant can comprise either amide groups or ester groups attached to the polymeric backbone.

While not wishing to be bound by any particular theory, it is believe that the surfactant interacts with copper metal present on the surface of the substrate via the azole group. The interaction of the azole groups with copper metal serves to inhibit the rate of oxidation by oxidizing agents that may be present in the CMP system. Further, the polymers to which the azole groups are attached act as steric barriers to overpolishing of the copper layer by the action of abrasive particles and/or the polishing pad of the CMP system. Thus, the azole groups are believed to act also as anchor points for a protective polymeric film.

The surfactant can be any suitable surfactant comprising at least one azole group that is not polyvinylimidazole and wherein the surfactant does not comprise cyclic imide groups or both pendant amide and ester groups. An azole group is a 5-membered heterocyclic group consisting of carbon atoms and nitrogen atoms. The azole group can be any suitable azole group. Preferably, the azole group is selected from the group consisting of 1,2,3-triazole, 1,2,4-triazole, pyrazole, imidazole, indazole, tetrazole, benzimidazole, benzotriazole, alkylated derivatives thereof, and combinations thereof. Generally, azole groups have two or more positions available for substitution. One position will be chemically bonded to the surfactant, and the at least one remaining position on the azole group can be substituted with, for example, hydrogen or with a carbon atom of a functional group. The azole group is preferably substituted with hydrogen or an alkyl group. However, the azole group can be substituted with any suitable functional group as in the non-limiting examples of acyl, alkoxyacyl, aminoacyl, thio, alkylthio, arylthio, alkylsulfinyl, alkylsulfonyl, arylsulfinyl, arylsulfonyl, acylthio, nitro, amino, alkylamino, arylamino, phosphoryl, phosphonyl, phosphinyl, and ring-fused derivatives thereof.

In one embodiment, the surfactant comprises at least one azole group having a polyether chain attached thereto, wherein the polyether chain contains the repeating ether linkage —R—O—R—. Although the carbon atoms of the R groups can be bound to two oxygen atoms, e.g., as in polyacetals or polyketals, typically at least two carbon atoms will be positioned between any two oxygen atoms, such that each carbon will be bound to one oxygen atom. Furthermore, the R groups may be unbranched or branched. Examples of suitable polyethers include polyethylene oxides and polypropylene oxides, or polyethylene oxide-polypropylene oxide copolymers, known as poloxamers and commercially available as the Pluronic® family of surfactants. Polyethylene oxides, polypropylene oxides, and copolymers thereof may be prepared having any molecular weight and number of monomers comprising the polymer chain. The number of monomers comprising the polyether can be any suitable number but typically will be about 3 to about 10,000 (e.g., about 10 to about 5,000, or about 15 to about 1,000).

An embodiment of a surfactant comprising one azole group having a polyether chain attached thereto is a compound of the formula:

Het-X—$(CH_2CH_2O)_m(CH_2CHR^1O)_nR^2$ wherein Het is a heterocycle selected from the group consisting of 1,2,3-triazole, 1,2,4-triazole, pyrazole, indazole, tetrazole, benzimidazole, benzotriazole, and alkylated derivatives thereof chemically bonded to X via a carbon atom of the heterocycle or a nitrogen atom which is part of the heterocycle; X is $(CH_2)_m$ wherein m is an integer of 1-5, O, C(=O)O, $CH_2O$, $CH_2CH_2O$, or a direct link; m and n are integers from 0-20 with the proviso that m and n are not both 0; $R^1$ is selected from the group consisting of H or $C_1$-$C_{10}$ branched and straight chain alkyl and alkenyl; and $R^2$ is selected from the group consisting of H, $C_1$-$C_{10}$ branched and straight chain alkyl and alkenyl, and $C_3$-$C_{10}$ cycloalkyl.

The heterocycle can be chemically bonded to the polyether chain either directly via a chemical bond between a carbon or nitrogen atom of the heterocyclic ring and a carbon atom of the polyether chain, or via an intermediary connecting group selected from the group consisting of from 1 to 5 carbon atoms, an oxygen atom, an acyloxy group, a hydroxymethyl group, or a hydroxyethyl group, wherein the intermediary connecting group is chemically bonded to a ring atom of the heterocyclic group.

The polyether chain as represented by the partial formula $(CH_2CH_2O)_m(CH_2CHR^1O)_nR^2$ can be a homopolymer of ethylene oxide in which $R^1$ is H, a homopolymer of propylene oxide or alkylene oxide in which $R^1$ is methyl or alkyl, wherein $R^1$ is selected from the group consisting of H and $C_1$-$C_{10}$ branched and straight chain alkyl and alkenyl, or can be a copolymer of ethylene oxide and propylene oxide or alkylene oxide monomers, wherein m and n are integers from 0-20 with the proviso that m and n are not both 0, and wherein $R^2$ is selected from the group consisting of H, $C_1$-$C_{10}$ branched and straight chain alkyl and alkenyl, and $C_3$-$C_{10}$ cycloalkyl. The copolymer can be a random copolymer, alternating copolymer, periodic copolymer, block copolymer (e.g., AB, ABA, ABC, etc.), graft copolymer, or comb copolymer.

In another embodiment, the surfactant comprises at least one azole group having a polyacrylate chain attached thereto, wherein the polyacrylate chain contains the repeating unit —$CH_2CHR(COOH)$— wherein the R group is typically H or methyl. The number of monomers comprising the polyacrylate chain can be any suitable number but typically will be about 5 to about 10,000 (e.g., about 10 to about 5,000, or about 15 to about 1,000).

In another embodiment, the surfactant comprises at least one azole group having a polyamine chain attached thereto. In this context, polyamine refers to a polymer containing a repeating amine linkage —R—NR'—R—. A preferred example of a polyamine comprises repeat units of polyethyleneimine. Typically, polyethyleneimines are not linear because of the formation of reactive secondary amines during the polymerization process which further react with ethyleneimine, leading to branching in the polyethylenimine chain.

A preferred embodiment of a surfactant comprising at least one azole group having a polyamine chain attached thereto is represented by the formula:

Het-X—$(CH_2CH_2NR^3)_nR^4$ wherein

Het is a heterocycle selected from the group consisting of 1,2,3-triazole, 1,2,4-triazole, pyrazole, imidazole, indazole, tetrazole, benzimidazole, and benzotriazole chemically bonded to X via a carbon atom of the heterocycle or a nitrogen atom which is part of the heterocycle;

X is selected from the group consisting of $(CH_2)_m$ wherein m is an integer of 1-5, NH, C(=O)NH, $CH_2NH$, $CH_2CH_2NH$, or a direct link;

n is an integer from 1-20;

$R^3$ is H or $(CH_2CH_2NHR^5_2)_p$ wherein $R^5$ is a $C_1$-$C_5$ branched and straight chain alkyl and p is an integer of 1-5; and $R^4$ is selected from the group consisting of H, $C_1$-$C_{10}$ branched and straight chain alkyl and alkenyl, and $C_3$-$C_{10}$ cycloalkyl.

The heterocycle can be chemically bonded to the polyamine chain either directly via a chemical bond between a carbon or nitrogen atom of the heterocyclic ring and a carbon atom of the polyamine chain, or via an intermediary connecting group selected from the group consisting of 1 to 5 carbon atoms, a nitrogen atom, an acylamino group, an aminomethyl group, and an aminoethyl group, wherein the intermediary connecting group is chemically bonded to a ring atom of the heterocyclic group.

As noted above, polyethyleneimines typically are branched with aminoethyl groups attached to secondary nitrogen atoms of the polyethyleneimine chain. The aminoethyl groups can in turn be further substituted with one or more aminoethyl groups. Accordingly, the formula (CH$_2$CH$_2$NR$^3$)$_n$R$^4$ encompasses linear and branched polyethyleneimines without being limited to any specific substitution pattern or degree of substitution. Many different polyethyleneimines are available commercially or otherwise that have varying degrees of branching and substitution, all of which are suitable for incorporation into the surfactants of the invention. The polyethyleneimines can be further modified by additional reaction, e.g., methylation or ethoxylation.

In another embodiment, the surfactant can comprise two azole groups, as represented by the formula:

Het$^1$-X—(CH$_2$CHR$^6$Z)$_n$—Y-Het$^2$ wherein

Het$^1$ and Het$^2$ are independently selected from the group consisting of 1,2,3-triazole, 1,2,4-triazole, pyrazole, imidazole, indazole, tetrazole, benzimidazole, and benzotriazole wherein Het$^1$ is chemically bonded to X and Het$^2$ is chemically bonded to Y via a carbon atom of the heterocycle or a nitrogen atom which is part of the heterocycle;

X is (CH$_2$)$_m$ wherein m is an integer of 1-5, Z, C(=O)Z, CH$_2$Z, or a direct link;

n is an integer from 1-20;

R$^6$ is selected from the group consisting of H, C$_1$-C$_{10}$ branched and straight chain alkyl and, when Z is N, (CH$_2$CH$_2$NR$^7$$_2$)$_m$ wherein R$^7$ is a C$_1$-C$_5$ branched and straight chain alkyl and m is an integer of 1-5;

Y is (CH$_2$)$_m$ wherein m is as defined above, C(=O), or a direct link; and

Z is O or NR$^1$, wherein R$^1$ is as previously defined.

In another embodiment, the surfactant can comprise a polymer comprising three or more azole groups as a homopolymer or as a copolymer further comprising non-azole-containing monomers. Typically, the polymer will comprise about 50% or less of monomers comprising azole groups (e.g., about 40% or less, or about 30% or less), and preferably the polymer will comprise about 20% or less (e.g., about 15% or less, or about 10% or less) of monomers comprising azole groups, wherein the proportion of monomers is determined on either a weight basis or a molar basis. The non-azole-containing monomers can be any suitable non-azole-containing monomers. Preferred non-azole-containing monomers include acrylates, vinyl alcohols, vinyl esters, derivatives thereof, and equivalents thereof.

The polymer can comprise a polyester comprising monomers comprising at least one dicarboxylic acid and at least one diol, wherein the at least one dicarboxylic acid and/or diol comprises azole groups. A polyester in the context of the invention is a condensation polymer between dicarboxylic acids and diols comprising ester groups in the polymeric backbone resulting from the combination of carboxylic acid groups and hydroxyl groups.

Any suitable dicarboxylic acid or diol comprising azole groups can be incorporated into a polyester surfactant of the invention. The azole groups can be attached to the dicarboxylic acid or diol in any manner, either by carbon-carbon or carbon-nitrogen bonds with ring carbons or ring nitrogens of the azole, or through intermediate connecting atoms. Numerous methods exist for preparing dicarboxylic acids and diols comprising azole groups. A preferred dicarboxylic acid-containing azole is 1,2,3-triazole-4,5-dicarboxlic acid.

The polymer can comprise a polyamide comprising monomers comprising at least one dicarboxylic acid and at least one diamine, wherein the at least one dicarboxylic acid and/or diol comprises azole groups. A polyamide in the context of the invention is a condensation polymer between dicarboxylic acids and diamines comprising amide groups resulting from the combination of carboxylic acid groups and amine groups. Suitable dicarboxylic acids comprising azole groups can be as set forth herein.

The polymer can comprise a polyamine comprising three or more azole groups. The term "polyamine" in the context of the invention refers to linear polymers comprising nitrogen in the polymer backbone that are not derived from ethyleneimine monomers and that have two or more nitrogen atoms. Examples of polyamines include but are not limited to 1,3-diaminopropane, spermidine, and spermine.

In another embodiment, the polymer comprises chemical components A, B, and C. Component A is selected from the group consisting of one or more end groups selected from initiator fragments, chain transfer fragments, solvent fragments, and combinations thereof.

Component B is absent or is at least one ethylenically unsaturated monomer of the formula Het-W—CR$^8$=C(R$^9$)(R$^{10}$), wherein Het is a heterocycle selected from the group consisting of 1,2,3-triazole, 1,2,4-triazole, pyrazole, imidazole, indazole, tetrazole, benzimidazole, and benzotriazole chemically bonded to W via a carbon atom of the heterocycle or a nitrogen atom which is part of the heterocycle;

W is (CH$_2$)$_n$ wherein n is an integer of 1-10 or a direct link;

R$^8$ is H or C$_1$-C$_{10}$ branched and straight chain alkyl and alkenyl;

R$^9$ and R$^{10}$ are independently selected from the group consisting of H, C$_1$-C$_{10}$ branched and straight chain alkyl and alkenyl, C$_3$-C$_{10}$ cycloalkyl, and C$_6$-C$_{10}$ aryl; with the proviso that R$^8$, R$^9$, and R$^{10}$ are not H if component C is absent.

Component C is absent or includes an ethylenically unsaturated group of the formula CH(R$^{11}$)=C(R$^{12}$)(R$^{13}$), wherein R$^{11}$ is selected from the group consisting of H, C$_1$-C$_{10}$ branched and straight chain alkyl and alkenyl, C$_3$-C$_{10}$ cycloalkyl, and Het-W wherein Het and W are as defined above;

R$^{12}$ and R$^{13}$ are independently selected from the group consisting of H, C$_1$-C$_5$ branched and straight-chain alkyl and alkenyl, phenyl, substituted phenyl, COR$^{14}$, and Het-W wherein Het and W are as defined above, wherein R$^{14}$ is H, alkyl, OR$^{15}$, or NR$^{16}$R$^{17}$, wherein R$^{15}$ is H or C$_1$-C$_5$ branched and straight chain alkyl, and wherein R$^{16}$ and R$^{17}$ are independently H, C$_1$-C$_{10}$ branched and straight chain alkyl, CN, or taken together form a 5-membered or 6-membered ring structure.

At least one of B and C comprises a heterocycle as defined herein.

Component A includes any initiator fragment derived from any initiator useful in initiating free radical polymerization. Such initiator fragments include but are not limited to peroxyesters (such as t-butylperbenzoate, t-amylperoxybenzoate, t-butylperoxy-2-ethylhexanoate, butylperacetate and t-butylperoxymaleic acid), dialkylperoxides (such as di-t-butylperoxide, dicumylperoxide and t-butylcumylperoxide), diacylperoxides (such as benzoylperoxide, lauroylperoxide and acetylperoxide), hydroperoxides (such as cumene hydroperoxide and t-butylhydroperoxide), azo compounds (such as azonitriles), azaamidines, and cyclic azaamidines.

Component A further includes for example end groups resulting from any chain transfer agent used in controlling the molecular weight of a free radical polymerization. Suitable chain transfer agents include but are not limited to alcohols, alkyl and aromatic thiols, alkyl phosphates, aryl phosphinic acids, alkyl phosphinic acids, hypophosphites, aldehydes, formates, alkyl halides, and alkyl aromatics such as toluene and xylenes.

Component B includes ethylenically-unsaturated monomers as defined herein. As noted above, at least one of Components B and C must comprise a heterocycle as defined herein. Component B can be synthesized by a variety of methods known to produce olefins from suitable precursors, e.g., via Wittig reactions on aldehydes or ketones, aldol condensations, elimination of halides, acid-catalyzed elimination of alcohols from acetals and ketals, and the like. Examples of suitable components comprising a heterocyclic group as defined above include but are not limited to 1-vinyl-1,2,3-triazole, which is described in *Heterocyclic Communications*, 8(1):61 (2002), and vinyl benzotriazoles such as are disclosed in U.S. Pat. No. 6,774,238.

Component C includes ethylenically-unsaturated monomers optionally containing a heterocyclic group as defined herein. Examples of suitable monomers for component C that do not include a heterocyclic group include but are not limited to (meth)acrylic monomers (such as (meth)acrylic acid, methyl(meth)acrylate, hydroxy(meth)acrylate, 2-hydroxyethyl acrylate, 2-hydroxypropyl acrylate, butyl (meth) acrylate, 2-ethylhexyl acrylate, decyl acrylate, lauryl(meth) acrylate, isodecyl(meth)acrylate, hydroxyethyl(meth) acrylate, and hydroxypropyl(meth)acrylate); cyclic anhydrides such as maleic anhydride; anhydrides such as itaconic anhydride and cyclohex-4-enyl tetrahydrophthalic anhydride; olefins such as ethylene, propylene, butylene, isobutylene, di-isobutylene, and alpha-olefins (such as a 1-butene, 1-octene, and 1-decene); styrene; substituted styrenes (such as alpha-methyl styrene, alpha-methylstyrene, 4-hydroxystyrene, and styrene sulfonic acid); butadiene; vinyl esters such as vinyl acetate, vinyl butyrate and other vinyl esters; vinyl monomers such as vinyl chloride, vinylidene chloride, and vinyl ethers (such as methyl vinyl ether, ethyl vinyl ether, propyl vinyl ether, butyl vinyl ether, and isobutyl vinyl ether); allyl ethers (such as allyl ether, allyl ethyl ether, allyl butyl ether, allyl glycidyl ether, and allyl carboxy ethyl ether), ethoxy vinyl ethers such as vinyl-2-(2-ethoxy-ethoxy)ethyl ether and methoxyethoxy vinyl ether; N-vinyl amides such as vinylformamide and vinylacetamide; stilbene; divinyl benzene; (meth)acrylamides; and (meth)acrylonitrile. The use of the term "(meth)" followed by another term such as acrylate or acrylamide, as used throughout the disclosure, refers to acrylates or acrylamides, respectively, as well as methacrylates or methacrylamides, respectively.

Preferred examples of component C comprise an ethylenically unsaturated group of the formula CH($R^{11}$)=C($R^{12}$) ($R^{13}$), wherein $R^{11}$ is selected from the group consisting of H, $C_1$-$C_{10}$ branched and straight chain alkyl and alkenyl, and $C_3$-$C_{10}$ cycloalkyl, wherein $R^{12}$ is COOR$^{15}$ wherein $R^{15}$ is as defined herein, and wherein $R^{13}$ is selected from the group consisting of H, $C_1$-$C_5$ branched and straight chain alkyl, phenyl, and substituted phenyl.

Examples of preferred monomers for component C not comprising a heterocyclic group include (meth)acrylic acid, methyl(meth)acrylate, hydroxy(meth)acrylate, 2-hydroxyethyl acrylate, 2-hydroxypropyl acrylate, butyl(meth)acrylate, 2-ethylhexyl(meth)acrylate, decyl(meth)acrylate, lauryl (meth)acrylate, isodecyl(meth)acrylate, hydroxyethyl(meth) acrylate, and hydroxypropyl(meth)acrylate.

As noted above, component C can comprise a heterocyclic group. Many synthetic methods exist to prepare substituted monomers of component C from suitably functionalized azoles. For example, the Wittig reaction of aldehyde-substituted azoles (e.g., imidazole 4-carboxaldehyde) with (carboalkoxymethylene)triphenylphosphoranes followed by hydrolysis of the resulting acrylic acid esters leads to azole-substituted acrylates (e.g., urocanic acid). Similar transformations will be readily apparent to one of ordinary skill in the art.

In another embodiment, the polymer comprises a hydrophilic polymer or copolymer further functionalized with azole groups. A preferred hydrophilic polymer or copolymer is a polyvinyl alcohol. Polyvinyl alcohol refers to a polymer formally comprising hydroxyethyl repeating units derived from polymerization of vinyl acetate followed by complete or partial hydrolysis of the acetate groups, and is available in a range of molecular weights. The secondary hydroxyl groups of polyvinyl alcohol can be esterified with acid chlorides or acid anhydrides comprising azole groups to yield azole-functionalized polyvinyl alcohols. For example, the acid chloride or other suitable reactive acyl derivative such as a mixed anhydride of benzotriazole-5-carboxylic acid can be reacted with polyvinyl alcohol to produce a benzotriazole-functionalized polyvinyl alcohol. Other esterification reactions include those with chloroformate esters to yield polyvinyl carbonates, with urea to yield polymeric carbamate esters, and with isocyanates to form substituted carbamate esters. The hydroxyl groups of polyvinyl alcohol can further be converted into acetals by reaction with suitable azole-containing aldehydes. Other variations for the functionalization of polyvinyl alcohol with azole groups will be readily apparent to one of ordinary skill in the art.

In addition to polymeric surfactants comprising pendant heterocyclic groups comprising azoles, the azole group can comprise at least a part of the polymeric backbone. An example of this embodiment has already been mentioned, e.g., polyesters and polyamides comprising 1,2,3-triazole-4,5-dicarboxylic acid.

The surfactant comprising at least one azole group can have any suitable molecular weight. Typically, the surfactant comprising at least one azole group will have a molecular weight of about 1000 or more (e.g., about 2000 or more, or about 5000 or more). Preferably, the surfactant comprising at least one azole group will have a molecular weight of about 100000 or less (e.g., about 50000 or less, or about 10000 or less).

The surfactant comprising at least one azole group can be present in the CMP system, particularly the polishing composition thereof, in any suitable amount. For example, the polishing composition typically comprises about 0.005 wt. % or more (e.g., about 0.005 wt. % to about 5 wt. %) surfactant based on the weight of the liquid carrier and any components dissolved or suspended therein. Preferably, the polishing composition comprises about 0.0075 wt. % to about 1 wt. % (e.g., about 0.01 wt. % to about 0.5 wt. %) surfactant.

The CMP system optionally further comprises a means of oxidizing one or more components of a metal layer comprising copper. The means for oxidizing the metal layer comprising copper can be any suitable means for oxidizing the metal layer, which includes any chemical or physical means. In a CMP system that does not involve electrochemical polishing, preferably the means for oxidizing the metal layer is a chemical oxidizing agent. In a CMP system involving electrochemical polishing, preferably the means for oxidizing the substrate comprises a device for applying a time-varying potential (e.g., anodic potential) to the substrate comprising the metal layer (e.g., electronic potentiostat).

The chemical oxidizing agent can be any suitable oxidizing agent. Suitable oxidizing agents include inorganic and organic per-compounds, bromates, nitrates, chlorates, chromates, iodates, iron and copper salts (e.g., nitrates, sulfates, EDTA salts, and citrates), rare earth and transition metal oxides (e.g., osmium tetraoxide), potassium ferricyanide, potassium dichromate, iodic acid, and the like. A per-compound (as defined by Hawley's Condensed Chemical Dictionary) is a compound containing at least one peroxy group (—O—O—) or a compound containing an element in its highest oxidation state. Examples of compounds containing at least one peroxy group include but are not limited to hydrogen peroxide and its adducts such as urea hydrogen peroxide and percarbonates, organic peroxides such as benzoyl peroxide, peracetic acid, and di-tert-butyl peroxide, monopersulfates ($SO_5^{2-}$), dipersulfates ($S_2O_8^{2-}$), and sodium peroxide. Examples of compounds containing an element in its highest oxidation state include but are not limited to periodic acid, periodate salts, perbromic acid, perbromate salts, perchloric acid, perchlorate salts, perboric acid, perborate salts, and permanganates. The oxidizing agent preferably is hydrogen peroxide, dipersulfate, or iodate. The CMP system (particularly the polishing composition) typically comprises about 0.1 wt. % to about 15 wt. % (e.g., about 0.2 wt. % to about 10 wt. %, about 0.5 wt. % to about 8 wt. %, or about 1 wt. % to about 5 wt. %) oxidizing agent, based on the weight of the liquid carrier and any compounds dissolved or suspended therein.

The device for applying time-varying potential to the substrate can be any suitable such device. The means for oxidizing the substrate preferably comprises a device for applying a first potential (e.g., a more oxidizing potential) during an initial stage of the polishing and applying a second potential (e.g., a less oxidizing potential) at or during a later stage of polishing, or a device for changing the first potential to the second potential during an intermediate stage of polishing, e.g., continuously reducing the potential during the intermediate stage or rapidly reducing the potential from a first, higher oxidizing potential to a second, lower oxidizing potential after a predetermined interval at the first, higher oxidizing potential. For example, during the initial stage(s) of the polishing, a relatively high oxidizing potential is applied to the substrate to promote a relatively high rate of oxidation/dissolution/removal of the substrate. When polishing is at a later stage, e.g., when approaching an underlying barrier layer, the applied potential is reduced to a level producing a substantially lower or negligible rate of oxidation/dissolution/removal of the substrate, thereby eliminating or substantially reducing dishing, corrosion, and erosion. The time-varying electrochemical potential is preferably applied using a controllably variable DC power supply, e.g., an electronic potentiostat. U.S. Pat. No. 6,379,223 further describes a means for oxidizing a substrate by applying a potential.

The CMP system optionally comprises a chelating agent. The chelating agent (e.g., complexing agent) is any suitable chemical additive that enhances the removal rate of the substrate layer being removed. Suitable chelating or complexing agents can include, for example, carbonyl compounds (e.g., acetylacetonates, and the like), di-, tri-, or polyalcohols (e.g., ethylene glycol, pyrocatechol, pyrogallol, tannic acid, and the like) and amine-containing compounds (e.g., ammonia, amino acids, amino alcohols, di-, tri-, and polyamines, and the like). The choice of chelating or complexing agent will depend on the type of substrate layer being removed in the course of polishing a substrate with the polishing composition. The amount of chelating or complexing agent used in the CMP system (particularly the polishing composition) typically is about 0.1 to about 10 wt. %, preferably about 1 to about 5 wt. %, based on the weight of the liquid carrier and any components dissolved or suspended within.

The polishing composition can have any suitable pH. Desirably, the polishing composition will have a pH of about 11 or less (e.g., about 10 or less). Preferably, the polishing composition will have a pH of about 2 or more (e.g., about 3 or more). More preferably, the polishing composition will have a pH of about 4 to about 9.

The CMP system optionally further comprises an anti-foaming agent. The anti-foaming agent can be any suitable anti-foaming agent. Suitable antifoaming agents include, but are not limited to, silicon-based and acetylenic diol-based antifoaming agents. The amount of anti-foaming agent present in the CMP system (particularly the polishing composition) typically is about 40 ppm to about 140 ppm, based on the weight of the liquid carrier and any components dissolved or suspended within.

The CMP system optionally further comprises a biocide. The biocide can be any suitable biocide, for example an isothiazolinone biocide. The amount of biocide used in the CMP system (particularly the polishing composition) typically is about 1 to about 200 ppm, preferably about 10 to about 100 ppm, based on the weight of the liquid carrier and any components dissolved or suspended within.

A liquid carrier is used to facilitate the application of the surfactant, the abrasive (when present and suspended in the liquid carrier), and any optional additives (e.g., an oxidizing agent and/or a chelating agent) to the surface of a suitable substrate to be polished or planarized. The liquid carrier is typically an aqueous carrier and can be water alone, can comprise water and a suitable water-miscible solvent, or can be an emulsion. Suitable water-miscible solvents include alcohols such as methanol, ethanol, and the like. Preferably, the aqueous carrier consists of water, more preferably deionized water.

The polishing composition of the invention (i.e., the liquid carrier and any components dissolved or suspended therein) can be prepared by any suitable technique, many of which are known to those skilled in the art. The polishing composition can be prepared in a batch or continuous process. Generally, the polishing composition can be prepared by combining the components thereof in any order. The term "component" as used herein includes individual ingredients (e.g., surfactant, oxidizing agents, etc.) as well as any combination of ingredients (e.g., surfactant, oxidizing agents, chelating agents, etc.).

For example, the surfactant can be dispersed in water. The optional abrasive, optional oxidizing agent, and optional chelating agent can then be added, and mixed by any method that is capable of incorporating the components into the polishing composition. The polishing composition can be prepared prior to use, with one or more components, such as an optional oxidizing agent, added to the polishing composition just before use (e.g., within about 1 minute before use, or within about 1 hour before use, or within about 7 days before use). The pH can be adjusted at any suitable time. The polishing composition also can be prepared by mixing the components at the surface of the substrate during the polishing operation.

The polishing composition of the invention can be supplied as a multi-package system with one or more components of the polishing composition in separate compositions that are combined prior to use. For example, a first package can comprise all of the polishing composition except for the optional oxidizing agent and optionally a portion of the liquid carrier. The oxidizing agent can be placed in a second package either in pure form or in a mixture with all or a portion of the liquid carrier, e.g., water, for the polishing composition. The oxidizing agent desirably is provided separately and is combined, e.g., by the end-user, with the other components of the polishing composition shortly before use (e.g., 1 week or less prior to use, 1 day or less prior to use, 1 hour or less prior to use, 10 minutes or less prior to use, or 1 minute or less prior to use). Other two-package, or three- or more package, combinations of the components of the polishing composition of the invention are within the knowledge of one of ordinary skill in the art.

The invention further provides a method for chemical-mechanical polishing of substrates using the polishing system of the invention. In particular, the method involves (i) contacting a substrate with the chemical-mechanical polishing system described herein, (ii) moving the polishing pad relative to the substrate, and (iii) abrading at least a portion of the substrate to polish the substrate.

Although the CMP system of the invention is useful for polishing any substrate, the CMP system is particularly useful in the polishing of a substrate comprising at least one metal layer comprising copper. The substrate can be any suitable copper-containing substrate (e.g., an integrated circuit, metals, ILD layers, semiconductors, thin films, MEMS, magnetic heads) and can further comprise any suitable insulating, metal, or metal alloy layer (e.g., metal conductive layer). The insulating layer can be a metal oxide, porous metal oxide, glass, organic polymer, fluorinated organic polymer, or any other suitable high or low-κ insulating layer. The insulating layer preferably is a silicon-based metal oxide. The substrate preferably further comprises a metal layer comprising tantalum, tungsten, or titanium.

The CMP system is capable of planarizing or polishing a copper-containing metal layer of a substrate at a relatively high rate, with desirable planarization efficiency, uniformity, removal rate, and low defectivity. In particular, the CMP system of the invention gives rise to substantially lower fine line corrosion, dishing, and pitting of the copper-containing metal layer of the substrate. Additionally, the CMP system of the invention gives rise to substantially reduced erosion of silicon oxide in the CMP of substrates comprising a metal (e.g., copper) and silicon oxide.

In accordance with the invention, a substrate can be planarized or polished with the CMP system described herein by any suitable technique. The polishing method of the invention is particularly suited for use in conjunction with a chemical-mechanical polishing (CMP) apparatus. Typically, the apparatus comprises a platen, which, when in use, is in motion and has a velocity that results from orbital, linear, or circular motion, a polishing pad in contact with the platen and moving with the platen when in motion, and a carrier that holds a substrate to be polished by contacting and moving relative to the surface of the polishing pad. The polishing of the substrate takes place by the substrate being placed in contact with the polishing pad and the polishing composition of the invention and then the polishing pad moving relative to the substrate, so as to abrade at least a portion of the substrate to polish the substrate.

A substrate can be planarized or polished with the polishing composition with any suitable polishing pad (e.g., polishing surface). Suitable polishing pads include, for example, woven and non-woven polishing pads. Moreover, suitable polishing pads can comprise any suitable polymer of varying density, hardness, thickness, compressibility, ability to rebound upon compression, and compression modulus. Suitable polymers include, for example, polyvinylchloride, polyvinylfluoride, nylon, fluorocarbon, polycarbonate, polyester, polyacrylate, polyether, polyethylene, polyamide, polyurethane, polystyrene, polypropylene, coformed products thereof, and mixtures thereof.

Desirably, the CMP apparatus further comprises an in situ polishing endpoint detection system, many of which are known in the art. Techniques for inspecting and monitoring the polishing process by analyzing light or other radiation reflected from a surface of the workpiece are known in the art. Such methods are described, for example, in U.S. Pat. Nos. 5,196,353, 5,433,651, 5,609,511, 5,643,046, 5,658,183, 5,730,642, 5,838,447, 5,872,633, 5,893,796, 5,949,927, and 5,964,643. Desirably, the inspection or monitoring of the progress of the polishing process with respect to a workpiece being polished enables the determination of the polishing end-point, i.e., the determination of when to terminate the polishing process with respect to a particular workpiece.

The following examples further illustrate the invention but, of course, should not be construed as in any way limiting its scope.

EXAMPLE 1

This example demonstrates the preparation of a surfactant comprising an azole group, specifically penta(ethylene glycol)benzotriazole-5-carboxylate.

To a mixture of methanesulfonic acid (190 mL) and aluminum oxide (57.7 g, 0.57 mole) were added benzotriazole-5-carboxylic acid (30.8 g, 0.19) mole) and pentaethylene glycol (45.0 g, 0.19 mole), successively. The mixture was stirred at 80° C. for 30 min and then cooled. The mixture was partitioned between water and chloroform, and the aqueous layer was further extracted with chloroform. The combined organic extracts were washed with aqueous sodium bicarbonate, dried, and evaporated. Chromatography of the residue over silica gel using 5% methanol-methylene chloride as eluent gave the desired compound (23.0 g) as an oil. The structure was supported by $^1$H NMR.

EXAMPLE 2

This example demonstrates the preparation of a surfactant comprising two azole groups, specifically penta(ethylene glycol)bis(benzotriazole-5-carboxylate).

To a mixture of methanesulfonic acid (200 mL) and aluminum oxide (41.0 g, 0.40 mole) was added benzotriazole-5-carboxylic acid (40.0 g, 0.25 mole) and pentaethylene glycol (20.0 g, 0.08 mole). The mixture was stirred at 90° C. for 60 min and then cooled. The mixture was partitioned between water and chloroform, and the aqueous layer was further extracted with chloroform. The combined organic extracts were washed with aqueous sodium bicarbonate, dried, and evaporated. Chromatography of the residue over silica gel using 2% methanol-methylene chloride as eluent gave the title compound (20.0 g) as an oil. The structure was supported by $^1$H NMR.

EXAMPLE 3

This example shows the effect on dishing and erosion in the polishing of a copper-containing substrate resulting from addition of a surfactant comprising at least one azole group to a polishing composition in accordance with the invention.

Similar substrates comprising copper deposited on a tantalum-coated patterned silicon oxide substrate were used as the test substrates. The patterns on the substrates comprised two trench widths, 100 μm and 10 μm. The polishing experiments were performed in two phases, with the first phase performed at 10.3 kPa (1.5 psi) downforce pressure of the substrate against the polishing pad for a first duration of time (Phase 1), and the second phase performed at 6.9 kPa (1 psi) downforce pressure of the substrate against the polishing pad for a second duration of time (Phase 2). The polishing experiments involved use of an Applied Materials Mirra polishing tool at a 103 rpm platen speed, a 97 rpm carrier speed, a constant polishing composition flow rate, and use of in-situ conditioning of a hard polyurethane CMP pad.

The substrates were polished with different polishing compositions (Compositions A, B, and C). Each of Polishing Compositions A-C comprised 1.0 wt. % of tartaric acid, 0.1 wt. % of polyacrylic acid, 500 ppm of 1,2,4-triazole, 1.9 wt. % of fumed alumina, 1.0 wt. % of hydrogen peroxide, and 0.3 wt. % of ammonium hydroxide in deionized water at a pH of 8.1. Polishing Composition B further contained 100 ppm of benzotriazole, and Polishing Composition C further contained 100 ppm of penta(ethylene glycol)benzotriazole-5-carboxylate (the product of Example 1).

Following use of the polishing compositions, dishing at each of the two trench widths was determined as the difference in height at the middle of the trenches and the height of silicon oxide at the edges of the trenches. Erosion was determined as the difference in height of oxide at the edges of the trenches and the height of oxide outside of the patterned area of the substrates. The results are set forth in the Table.

TABLE

Effect of azole-containing surfactant on dishing and erosion

| Polishing Composition | Dishing (Å) (100 μm trench) | Dishing (Å) (10 μm trench) | Erosion (Å) | Phase 1 (sec) | Phase 2 (sec) |
|---|---|---|---|---|---|
| A (control) | 600 | 300 | 400 | 83 | 138 |
| B (comparative) | 450 | 230 | 200 | 78 | 129 |
| C (inventive) | 305 | 110 | 65 | 67 | 175 |

As is apparent from the results set forth in the Table, Polishing Composition C containing 100 ppm of penta(ethylene glycol)benzotriazole-5-carboxylate showed an approximately 32% decrease in dishing on 100 μm trenches, approximately 52% decrease in dishing on 10 μm trenches, and approximately 68% decrease in erosion of oxide as compared to Polishing Composition B containing benzotriazole. Polishing Composition C showed an approximately 49% decrease in dishing on 100 μm trenches, approximately 63% decrease in dishing on 10 μm trenches, and approximately 84% decrease in erosion of oxide as compared to the control composition, i.e., Composition A. These results demonstrate that dishing and erosion of copper-containing patterned silicon oxide substrates can be substantially reduced through the use of a polishing composition in accordance with the invention.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A chemical-mechanical polishing system comprising:
   (a) a polishing component selected from the group consisting of a polishing pad, an abrasive, and a combination thereof,
   (b) a surfactant comprising at least one azole group having a polymer chain attached thereto, wherein the surfactant is not polyvinylimidazole and wherein the surfactant does not comprise cyclic imide groups or both pendant amide and ester groups, and
   (c) a liquid carrier.

2. The polishing system of claim 1, wherein the at least one azole group is selected from the group consisting of 1,2,3-triazole, 1,2,4-triazole, pyrazole, imidazole, indazole, tetrazole, benzimidazole, benzotriazole, alkylated derivatives thereof, and combinations thereof.

3. The polishing system of claim 1, wherein the surfactant comprises at least one azole group having a polyether chain attached thereto.

4. The polishing system of claim 1, wherein the surfactant comprises at least one azole group having a polyacrylate chain attached thereto.

5. The polishing system of claim 3, wherein the surfactant comprises a compound of the formula Het-X—$(CH_2CH_2O)_m$ $(CH_2CHR^1O)_nR^2$, wherein Het is a heterocycle selected from the group consisting of 1,2,3-triazole, 1,2,4-triazole, pyrazole, imidazole, indazole, tetrazole, benzimidazole, and benzotriazole chemically bonded to X via a carbon atom of the heterocycle or a nitrogen atom which is part of the heterocycle;

X is $(CH_2)_p$ wherein p is an integer of 1-5, O, C(=O)O, $CH_2O$, $CH_2CH_2O$, or a direct link;

m and n are integers from 0-20 with the proviso that m and n are not both 0;

$R^1$ is selected from the group consisting of H and $C_1$-$C_{10}$ branched and straight chain alkyl and alkenyl; and $R^2$ is selected from the group consisting of H, $C_1$-$C_{10}$ branched and straight chain alkyl and alkenyl, and $C_3$-$C_{10}$ cycloalkyl.

6. The polishing system of claim 1, wherein the surfactant comprises at least one azole group having a polyamine chain attached thereto.

7. The polishing system of claim 6, wherein the surfactant comprises a compound of the formula Het-X—$(CH_2CH_2NR^3)_nR^4$, wherein Het is a heterocycle selected from the group consisting of 1,2,3-triazole, 1,2,4-triazole, pyrazole, imidazole, indazole, tetrazole, benzimidazole, and benzotriazole chemically bonded to X via a carbon atom of the heterocycle or a nitrogen atom which is part of the heterocycle;

X is selected from the group consisting of $(CH_2)_m$ wherein m is an integer of 1-5, NH, C(=O)NH, $CH_2NH$, $CH_2CH_2NH$, and a direct link;

n is an integer from 1-20;

$R^3$ is H or $(CH_2CH_2NHR^5_2)_p$ wherein $R^5$ is a $C_1$-$C_5$ branched and straight chain alkyl and p is an integer of 1-5; and $R^4$ is selected from the group consisting of H, $C_1$-$C_{10}$ branched and straight chain alkyl and alkenyl, and $C_3$-$C_{10}$ cycloalkyl.

8. The polishing system of claim 1, wherein the surfactant comprises a compound of the formula $Het^1$-X—$(CH_2CHR^6Z)_n$—Y-$Het^2$, wherein $Het^1$ and $Het^2$ are independently selected from the group consisting of 1,2,3-triazole, 1,2,4-triazole, pyrazole, imidazole, indazole, tetrazole, benzimidazole, and benzotriazole wherein $Het^1$ is chemically bonded to X, and wherein $Het^2$ is chemically bonded to Y via a carbon atom of the heterocycle or a nitrogen atom which is part of the heterocycle;

X is $(CH_2)_m$ wherein m is an integer of 1-5, Z, C(=O)Z, $CH_2Z$, or a direct link;

n is an integer from 1-20;

$R^6$ is selected from the group consisting of H, $C_1$-$C_{10}$ branched and straight chain alkyl and, when Z is N, $(CH_2CH_2NR^7_2)_m$ wherein $R^7$ is a $C_1$-$C_5$ branched and straight chain alkyl and m is an integer of 1-5;

Y is $(CH_2)_m$ wherein m is as defined above, C(=O), or a direct link; and

Z is O or $NR^1$, wherein $R^1$ is selected from the group consisting of H and $C_1$-$C_{10}$ branched and straight chain alkyl and alkenyl.

9. The polishing system of claim 1, wherein the surfactant comprises a polymer comprising three or more azole groups.

10. The polishing system of claim 9, wherein the polymer comprises a polyester comprising monomers comprising at least one dicarboxylic acid and at least one diol, wherein the at least one dicarboxylic acid and/or diol comprises azole groups.

11. The polishing system of claim 9, wherein the surfactant comprises about 20% or less of monomers comprising azole groups.

12. The polishing system of claim 10, wherein the polyester comprises 1,2,3-triazole-4,5-dicarboxylic acid repeating groups.

13. The polishing system of claim 9, wherein the polymer comprises a polyamide comprising monomers comprising at least one dicarboxylic acid and at least one diamine, wherein the at least one dicarboxylic acid and/or diamine comprises azole groups.

14. The polishing system of claim 13, wherein the polyamide comprises 1,2,3-triazole-4,5-dicarboxylic acid repeating groups.

15. The polishing system of claim 9, wherein the polymer comprises a polyamine comprising three or more azole groups.

16. The polishing system of claim 9, wherein the polymer comprises chemical components A, B, and C; wherein A is selected from the group consisting of one or more end groups selected from initiator fragments, chain transfer fragments, solvent fragments, and combinations thereof;

B is absent or is at least one ethylenically unsaturated monomer of the formula Het-W—$CR^8$=$C(R^9)(R^{10})$, wherein Het is a heterocycle selected from the group consisting of 1,2,3-triazole, 1,2,4-triazole, pyrazole, imidazole, indazole, tetrazole, benzimidazole, and benzotriazole chemically bonded to W via a carbon atom of the heterocycle or a nitrogen atom which is part of the heterocycle;

W is $(CH_2)_n$ wherein n is an integer of 1-10 or a direct link;

$R^8$ is H or $C_1$-$C_{10}$ branched and straight chain alkyl and alkenyl;

$R^9$ and $R^{10}$ are independently selected from the group consisting of H, $C_1$-$C_{10}$ branched and straight chain alkyl and alkenyl, $C_3$-$C_{10}$ cycloalkyl, and $C_6$-$C_{10}$ aryl; with the proviso that if C is absent then $R^8$, $R^9$, and $R^{10}$ are not H, and C is absent or includes an ethylenically unsaturated group of the formula $CH(R^{11})$=$C(R^{12})(R^{13})$, wherein $R^{11}$ is selected from the group consisting of H, $C_1$-$C_{10}$ branched and straight chain alkyl and alkenyl, $C_3$-$C_{10}$ cycloalkyl, and Het-W wherein Het and W are as defined above;

$R^{12}$ and $R^{13}$ are independently selected from the group consisting of H, $C_1$-$C_5$ branched and straight-chain alkyl and alkenyl, phenyl, substituted phenyl, $COR^{14}$, and Het-W wherein Het and W are as defined above, wherein $R^{14}$ is H, alkyl, $OR^{15}$, or $NR^{16}R^{17}$, wherein $R^{15}$ is H or $C_1$-$C_5$ branched and straight chain alkyl, wherein $R^{16}$ and $R^{17}$ are independently H, $C_1$-$C_{10}$ branched and straight chain alkyl, CN, or taken together form a 5-membered or 6-membered ring structure, with the proviso that at least one of B and C comprises a heterocycle as defined herein.

17. The polishing system of claim 16, wherein C comprises an ethylenically unsaturated group of the formula $CH(R^{11})$=$C(R^{12})(R^{13})$, wherein $R^{11}$ is selected from the group consisting of H, $C_1$-$C_{10}$ branched and straight chain alkyl and alkenyl, and $C_3$-$C_{10}$ cycloalkyl, wherein $R^{12}$ is $COOR^{15}$ wherein $R^{15}$ is as defined herein, and wherein $R^{13}$ is selected from the group consisting of H, $C_1$-$C_5$ branched and straight chain alkyl, phenyl, and substituted phenyl.

18. The polishing system of claim 1, wherein the polymer comprises a hydrophilic polymer or copolymer functionalized with azole groups.

19. The polishing system of claim 18, wherein the polymer comprises polyvinyl alcohol functionalized with azole groups.

20. The polishing system of claim 1, wherein the azole group comprises at least a part of the polymer backbone.

21. The polishing system of claim 1, wherein the polishing system further comprises an abrasive suspended in the liquid carrier.

22. The polishing system of claim 21, wherein the abrasive is selected from the group consisting of alumina, ceria, germania, magnesia, silica, titania, zirconia, co-formed products thereof, and combinations thereof.

23. The polishing system of claim 1, wherein the polishing system comprises an abrasive fixed on a polishing pad.

24. The polishing system of claim 1, wherein the polishing system further comprises one or both of an oxidizing agent and a chelating agent.

25. A method of chemically-mechanically polishing a substrate, comprising:
   (i) contacting a substrate with a polishing system comprising:
      (a) a polishing component selected from the group consisting of a polishing pad, an abrasive, and a combination thereof,
      (b) a surfactant comprising at least one azole group having a polymer chain attached thereto, wherein the surfactant is not polyvinylimidazole and wherein the surfactant does not comprise cyclic imide groups or both of pendant amide and ester groups, and
      (c) a liquid carrier,
   (ii) moving the polishing pad relative to the substrate, and
   (iii) abrading at least a portion of the substrate to polish the substrate.

26. The method of claim 25, wherein the at least one azole group is selected from the group consisting of 1,2,3-triazole, 1,2,4-triazole, pyrazole, imidazole, indazole, tetrazole, benzimidazole, benzotriazole, alkylated derivatives thereof, and combinations thereof.

27. The method of claim 25, wherein the surfactant comprises at least one azole group having a polyether chain attached thereto.

28. The method of claim 25, wherein the surfactant comprises at least one azole group having a polyacrylate chain attached thereto.

29. The method of claim 27, wherein the surfactant comprises a compound of the formula Het-X—$(CH_2CH_2O)_m$ $(CH_2CHR^1O)_n R^2$, wherein
   Het is a heterocycle selected from the group consisting of 1,2,3-triazole, 1,2,4-triazole, pyrazole, imidazole, indazole, tetrazole, benzimidazole, and benzotriazole chemically bonded to X via a carbon atom of the heterocycle or a nitrogen atom which is part of the heterocycle;
   X is $(CH_2)_p$ wherein p is an integer of 1-5, O, C(=O)O, $CH_2O$, $CH_2CH_2O$, or a direct link;
   m and n are integers from 0-20 with the proviso that m and n are not both 0;
   $R^1$ is selected from the group consisting of H and $C_1$-$C_{10}$ branched and straight chain alkyl and alkenyl; and $R^2$ is selected from the group consisting of H, $C_1$-$C_{10}$ branched and straight chain alkyl and alkenyl, and $C_3$-$C_{10}$ cycloalkyl.

30. The method of claim 25, wherein the surfactant comprises at least one azole group having a polyamine chain attached thereto.

31. The method of claim 30, wherein the surfactant comprises a compound of the formula Het-X—$(CH_2CH_2NR^3)_n R^4$, wherein
   Het is a heterocycle selected from the group consisting of 1,2,3-triazole, 1,2,4-triazole, pyrazole, imidazole, indazole, tetrazole, benzimidazole, and benzotriazole chemically bonded to X via a carbon atom of the heterocycle or a nitrogen atom which is part of the heterocycle;
   X is selected from the group consisting of $(CH_2)_m$ wherein m is an integer of 1-5, NH, C(=O)NH, $CH_2NH$, $CH_2CH_2NH$, and a direct link;
   n is an integer from 1-20;
   $R^3$ is H or $(CH_2CH_2NHR^5{}_2)_p$ wherein $R^5$ is a $C_1$-$C_5$ branched and straight chain alkyl and p is an integer of 1-5; and
   $R^4$ is selected from the group consisting of H, $C_1$-$C_{10}$ branched and straight chain alkyl and alkenyl, and $C_3$-$C_{10}$ cycloalkyl.

32. The method of claim 25, wherein the surfactant comprises a compound of the formula $Het^1$-X—$(CH_2CHR^6Z)_n$—Y-$Het^2$, wherein
   $Het^1$ and $Het^2$ are independently selected from the group consisting of 1,2,3-triazole, 1,2,4-triazole, pyrazole, imidazole, indazole, tetrazole, benzimidazole, and benzotriazole wherein $Het^1$ is chemically bonded to X, and wherein $Het^2$ is chemically bonded to Y via a carbon atom of the heterocycle or a nitrogen atom which is part of the heterocycle;
   X is $(CH_2)_m$ wherein m is an integer of 1-5, Z, C(=O)Z, $CH_2Z$, or a direct link;
   n is an integer from 1-20;
   $R^6$ is selected from the group consisting of H, $C_1$-$C_{10}$ branched and straight chain alkyl and, when Z is N, $(CH_2CH_2NR^7{}_2)_m$ wherein $R^7$ is a $C_1$-$C_5$ branched and straight chain alkyl and m is an integer of 1-5;
   Y is $(CH_2)_m$ wherein m is as defined above, C(=O), or a direct link; and
   Z is O or $NR^1$, wherein $R^1$ is selected from the group consisting of H and $C_1$-$C_{10}$ branched and straight chain alkyl and alkenyl.

33. The method of claim 25, wherein the surfactant comprises a polymer comprising three or more azole groups.

34. The method of claim 33, wherein the polymer comprises a polyester comprising monomers comprising at least one dicarboxylic acid and at least one diol, wherein the at least one dicarboxylic acid and/or diol comprises azole groups.

35. The method of claim 33, wherein the surfactant comprises about 20% or less of monomers comprising azole groups.

36. The method of claim 34, wherein the polyester comprises 1,2,3-triazole-4,5-dicarboxylic acid repeating groups.

37. The method of claim 33, wherein the polymer comprises a polyamide comprising monomers comprising at least one dicarboxylic acid and at least one diamine, wherein the at least one dicarboxylic acid and/or diamine comprises azole groups.

38. The method of claim 37, wherein the polyamide comprises 1,2,3-triazole-4,5-dicarboxylic acid repeating groups.

39. The method of claim 33, wherein the polymer comprises a polyamine comprising three or more azole groups.

40. The method of claim 33, wherein the polymer comprises chemical components A, B, and C; wherein A is selected from the group consisting of one or more end groups selected from initiator fragments, chain transfer fragments, solvent fragments, and combinations thereof;

B is absent or is at least one ethylenically unsaturated monomer of the formula Het-W—$CR^8$=$C(R^9)(R^{10})$, wherein Het is a heterocycle selected from the group consisting of 1,2,3-triazole, 1,2,4-triazole, pyrazole, imidazole, indazole, tetrazole, benzimidazole, and benzotriazole chemically bonded to W via a carbon atom of the heterocycle or a nitrogen atom which is part of the heterocycle;

W is $(CH_2)_n$ wherein n is an integer of 1-10 or a direct link;

$R^8$ is H or $C_1$-$C_{10}$ branched and straight chain alkyl and alkenyl;

$R^9$ and $R^{10}$ are independently selected from the group consisting of H, $C_1$-$C_{10}$ branched and straight chain alkyl and alkenyl, $C_3$-$C_{10}$ cycloalkyl, and $C_6$-$C_{10}$ aryl; with the proviso that if C is absent then $R^8$, $R^9$, and $R^{10}$ are not H, and C is absent or includes an ethylenically unsaturated group of the formula $CH(R^{11})$=$C(R^{12})(R^{13})$, wherein $R^{11}$ is selected from the group consisting of H, $C_1$-$C_{10}$ branched and straight chain alkyl and alkenyl, $C_3$-$C_{10}$ cycloalkyl, and Het-W wherein Het and W are as defined above;

$R^{12}$ and $R^{13}$ are independently selected from the group consisting of H, $C_1$-$C_5$ branched and straight-chain alkyl and alkenyl, phenyl, substituted phenyl, $COR^{14}$, and Het-W wherein Het and W are as defined above, wherein $R^{14}$ is H, alkyl, $OR^{15}$, or $NR^{16}R^{17}$, wherein $R^{15}$ is H or $C_1$-$C_5$ branched and straight chain alkyl, wherein $R^{16}$ and $R^{17}$ are independently H, $C_1$-$C_{10}$ branched and straight chain alkyl, CN, or taken together form a 5-membered or 6-membered ring structure, with the proviso that at least one of B and C comprises a heterocycle as defined herein.

41. The method of claim 40, wherein C comprises an ethylenically unsaturated group of the formula $CH(R^{11})$=$C(R^{12})(R^{13})$, wherein $R^{11}$ is selected from the group consisting of H, $C_1$-$C_{10}$ branched and straight chain alkyl and alkenyl, and $C_3$-$C_{10}$ cycloalkyl, wherein $R^{12}$ is $COOR^{15}$ wherein $R^{15}$ is as defined herein, and wherein $R^{13}$ is selected from the group consisting of H, $C_1$-$C_5$ branched and straight chain alkyl, phenyl, and substituted phenyl.

42. The method of claim 25, wherein the polymer comprises a hydrophilic polymer or copolymer functionalized with azole groups.

43. The method of claim 42, wherein the polymer comprises polyvinyl alcohol functionalized with azole groups.

44. The method of claim 25, wherein the azole group comprises at least a part of the polymer backbone.

45. The method of claim 25, wherein the polishing system further comprises an abrasive suspended in the liquid carrier.

46. The method of claim 45, wherein the abrasive is selected from the group consisting of alumina, ceria, germania, magnesia, silica, titania, zirconia, co-formed products thereof, and combinations thereof.

47. The method of claim 25, wherein the polishing system comprises an abrasive fixed on a polishing pad.

48. The method of claim 25, wherein the polishing system further comprises one or both of an oxidizing agent and a chelating agent.

49. The method of claim 25, wherein the substrate comprises one or both of a metallic layer and an insulating layer.

50. The method of claim 49, wherein the metallic layer comprises copper.

* * * * *